(12) United States Patent
Miura et al.

(10) Patent No.: US 9,502,553 B2
(45) Date of Patent: Nov. 22, 2016

(54) SEMICONDUCTOR DEVICE AND METHOD FOR MANUFACTURING THE SAME

(71) Applicant: MITSUBISHI ELECTRIC CORPORATION, Tokyo (JP)

(72) Inventors: Naruhisa Miura, Tokyo (JP); Shuhei Nakata, Tokyo (JP); Kenichi Ohtsuka, Tokyo (JP); Shoyu Watanabe, Tokyo (JP); Naoki Yutani, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/789,364

(22) Filed: Jul. 1, 2015

(65) Prior Publication Data

US 2015/0303297 A1    Oct. 22, 2015

Related U.S. Application Data

(63) Continuation of application No. 13/146,654, filed as application No. PCT/JP2009/058445 on Apr. 30, 2009, now Pat. No. 9,105,715.

(51) Int. Cl.
*H01L 29/78* (2006.01)
*H01L 29/10* (2006.01)
(Continued)

(52) U.S. Cl.
CPC ..... *H01L 29/7811* (2013.01); *H01L 23/53209* (2013.01); *H01L 29/0611* (2013.01);
(Continued)

(58) Field of Classification Search
CPC ............... H01L 23/62; H01L 27/0248; H01L 2924/0002; H01L 2224/762; H01L 2224/772; H01L 2224/782; H01L 29/7811; H01L 29/0616; H01L 29/0638; H01L 29/0696; H01L 29/1608; H01L 28/42372; H01L 28/45; H01L 29/4841; H01L 29/66068; H01L 29/7805
See application file for complete search history.

(56) References Cited

U.S. PATENT DOCUMENTS 4,080,618 A * 3/1978 Tango ................ H01L 21/2255
257/344
5,432,371 A   7/1995 Denner et al.
(Continued)

FOREIGN PATENT DOCUMENTS

JP   2001-44414    2/2001
JP   2005-64283    3/2005
(Continued)

OTHER PUBLICATIONS

International Search Report issued Aug. 11, 2009 in corresponding PCT/JP09/058445 filed Apr. 30, 2009.
(Continued)

*Primary Examiner* — Galina Yushina
(74) *Attorney, Agent, or Firm* — Oblon, McClelland, Maier & Neustadt, L.L.P.

(57) ABSTRACT

In a cell region of a first major surface of a semiconductor substrate of a first conductivity type, a first well of a second conductivity type is in an upper surface. A diffusion region of a first conductivity type is in the upper surface in the first well. A first gate insulating film is on the first well, and a first gate electrode on the first gate insulating film. A second well of a second conductivity type is in the upper surface of the first major surface on a peripheral portion of the cell region. A second gate insulating film is on the second well, and a thick field oxide film is on the peripheral side of the second gate insulating film. A second gate electrode is sequentially on the second gate insulating film and the field oxide film and electrically connected to the first gate electrode. A first electrode is connected to the first well, the second well and the diffusion region. A second electrode is connected on a second major surface of the semiconductor substrate. A gate wiring is on the field oxide film, going around a periphery of the cell region, and electrically connected to the second gate electrode. The gate wiring is a silicide of a constituting substance of the second gate electrode.

19 Claims, 12 Drawing Sheets

(51) Int. Cl.
  *H01L 29/16* (2006.01)
  *H01L 29/66* (2006.01)
  *H01L 23/532* (2006.01)
  H01L 29/06 (2006.01)
  H01L 29/423 (2006.01)
  H01L 29/45 (2006.01)
  H01L 29/49 (2006.01)

(52) U.S. Cl.
  CPC ....... *H01L29/0638* (2013.01); *H01L 29/1095* (2013.01); *H01L 29/1608* (2013.01); *H01L 29/4916* (2013.01); *H01L 29/4975* (2013.01); *H01L 29/66068* (2013.01); *H01L 29/7805* (2013.01); *H01L 29/0615* (2013.01); *H01L 29/0696* (2013.01); *H01L 29/4238* (2013.01); *H01L 29/42372* (2013.01); *H01L 29/45* (2013.01); *H01L 29/4941* (2013.01); *H01L 2924/0002* (2013.01)

(56) References Cited

U.S. PATENT DOCUMENTS

| | | | |
|---|---|---|---|
| 5,563,727 A | 10/1996 | Larson et al. | |
| 5,614,751 A * | 3/1997 | Yilmaz | H01L 29/402 257/341 |
| 5,973,359 A | 10/1999 | Kobayashi et al. | |
| 6,288,429 B1 | 9/2001 | Iwata et al. | |
| 6,396,147 B1 * | 5/2002 | Adachi | G02F 1/13458 257/347 |
| 6,599,644 B1 | 7/2003 | Zekentes et al. | |
| 6,818,958 B2 * | 11/2004 | Spring | H01L 29/7802 257/395 |
| 6,965,150 B2 | 11/2005 | Higashida et al. | |
| 7,271,068 B2 * | 9/2007 | Kubo | H01L 29/407 257/E21.384 |
| 7,397,083 B2 | 7/2008 | Amali et al. | |
| 8,860,039 B2 | 10/2014 | Miura et al. | |
| 9,006,819 B2 | 4/2015 | Hino et al. | |
| 2002/0160612 A1 | 10/2002 | Kobayashi | |
| 2007/0105289 A1 * | 5/2007 | Nomachi | H01L 21/0337 438/167 |
| 2008/0079078 A1 * | 4/2008 | Noguchi | H01L 29/7804 257/355 |
| 2010/0219417 A1 * | 9/2010 | Miura | H01L 29/0615 257/77 |
| 2014/0353686 A1 | 12/2014 | Miura et al. | |

FOREIGN PATENT DOCUMENTS

JP   09/058445     4/2009
JP   2009/058445   4/2009

OTHER PUBLICATIONS

Quirk et al. Semiconductor Manufacturing Technology, 2001, pp. 309-310.
Office Action issued Sep. 19, 2013 in German Application No. 11 2009 004 744.0 (with English Translation).
Combined Office Action and Search Report issued Aug. 21, 2013, in Chinese Patent Application No. 200980157510.7 (with partial English-language translation).
International Preliminary Report on Patentability with Written Opinion issued on Dec. 22, 2011 in corresponding PCT/JP2009/058445 filed on Apr. 30, 2009.

* cited by examiner

SEMICONDUCTOR DEVICE AND METHOD FOR MANUFACTURING THE SAME

CROSS-REFERENCE TO RELATED APPLICATIONS

This application is a continuation of U.S. application Ser. No. 13/146,654, filed at the U.S. Patent and Trademark Office on Jul. 28, 2011, which is national stage application of International Application No. PCT/JP09/058445, filed Apr. 30, 2009, and the entire contents of each of the above are incorporated herein by reference

BACKGROUND OF THE INVENTION

Field of the Invention

The present invention relates to a semiconductor device and a method for manufacturing the same including the switching elements having the MOS structure, and more specifically to a semiconductor device and a method for manufacturing the same that can improve reliability.

Background Art

In conventional vertical power MOSFETs, the gate electrodes are formed of poly-silicon, which has a poor conductivity. Therefore, the supply of a potential to the gate electrodes of respective unit cells is facilitated by forming a gate wiring consisting of a metal film composed of Al or the alloy thereof, or copper on the periphery of the chip to make the speed of switching higher (e.g., refer to Patent Documents 1 and 2). In the semiconductor under the gate wiring or the gate pad, a p-type well is formed for helping the elongation of the depletion layer and preventing the deterioration of pressure resistance.

A semiconductor device wherein minute diodes are linearly placed on the periphery of the cell region where unit cells are formed (including the gate pad portion) has been proposed (e.g., refer to FIGS. 1 and 2 of Patent Document 1). This diode can absorb holes from the p-type well to the n-type drain layer on the time of forward bias when the MOSFET is switched (turn-off) from the ON-state (forward bias) to the OFF-state (reverse bias), and the parasitic transistor can be prevented from turning ON (e.g., refer to FIG. 3 of Patent Document 1).

When the MOSFET is turned OFF, the voltage of the drain electrode (drain voltage) is rapidly elevated from 0 to several hundred volts. For this reason, the displacement current is flowed into the p-type well via the parasitic capacitor present between the p-type well and the n-type drain layer. This is the same in the p-type well of the MOSFET, the p-type well of a diode, or the p-type well below that gate wiring.

The p-type well is electrically connected to a field plate via a contact hole, and the field plate is electrically connected to a source electrode. Therefore, the displacement current flowed into the p-type well below the gate wiring flows into the source electrode via the contact hole and the field plate.

Patent Document 1: Japanese Patent Application Laid Open No. 5-198816

Patent Document 2: Japanese Patent Application Laid Open No. 2006-19608

DISCLOSURE OF THE INVENTION

Problems to be Solved by the Invention

The gate electrodes are composed of poly-silicon. Since the electrical conductivity of poly-silicon is poor, the locations of the gate pad, and the gate electrodes and are separated, temporal distortion occurs in the potentials of both.

Means for Solving the Problems

The first invention is a semiconductor device comprising: a semiconductor substrate of a first conductivity type having a first major surface and a second major surface facing to each other; a first well of a second conductivity type in an upper surface of the first major surface in a cell region of the first major surface; a diffusion region of a first conductivity type in the upper surface of the first major surface in the first well; a first gate insulating film on the first well; a first gate electrode on the first gate insulating film; a second well of a second conductivity type in the upper surface of the first major surface on a peripheral portion of the cell region; a second gate insulating film on the second well; a field oxide film on the second well on the peripheral side than the second gate insulating film and being thicker than the second gate insulating film; a second gate electrode provided sequentially on the second gate insulating film and the field oxide film and electrically connected to the first gate electrode; a first electrode electrically connected to the first well the second well and the diffusion region; a second electrode on the second major surface of the semiconductor substrate; a gate wiring on the field oxide film, going around a periphery of the cell region, and electrically connected to the second gate electrode; and a gate pad electrically connected to the gate wiring, wherein the gate wiring is a silicide of a constituting substance of the second gate electrode.

The second invention is A method for manufacturing a semiconductor device comprising: preparing a semiconductor substrate of a first conductivity type having a first major surface and a second major surface facing to each other; forming a first well of a second conductivity type in an upper surface of the first major surface in a cell region of the first major surface and a second well of a second conductivity type in the upper surface of the first major surface on a peripheral portion of the cell region; forming a diffusion region of a first conductivity type in the upper surface of the first major surface in the first well; forming a first gate insulating film on the first well and a second gate insulating film on the second well; forming a field oxide film on the second well on the peripheral side than the second gate insulating film and being thicker than the second gate insulating film; forming a first gate electrode on the first gate insulating film; forming a second gate electrode sequentially on the second gate insulating film and the field oxide film and electrically connected to the first gate electrode; forming an interlayer insulating film on the first major surface so as to cover the first gate electrode and the second gate electrode; etching the interlayer insulating film to form a first contact hole on he first well and the diffusion region and a second contact hole on the second well; etching the interlayer insulating film to expose a part of the second gate electrode; forming a gate wiring going around a periphery of the cell region on the field oxide film by a silicidation of the exposed part of the second gate electrode; forming a first electrode electrically connected to the first well and the diffusion region via the first contact hole and electrically connected to the second well via the second contact hole; forming a second electrode on the second major surface of the semiconductor substrate; and forming a gate pad electrically connected to the gate wiring.

Effect of the Invention

The present invention makes it possible that the supply of the potential to the gate electrodes of respective unit cells is facilitated, and increase in the speed of switching is sought.

Figure 1:
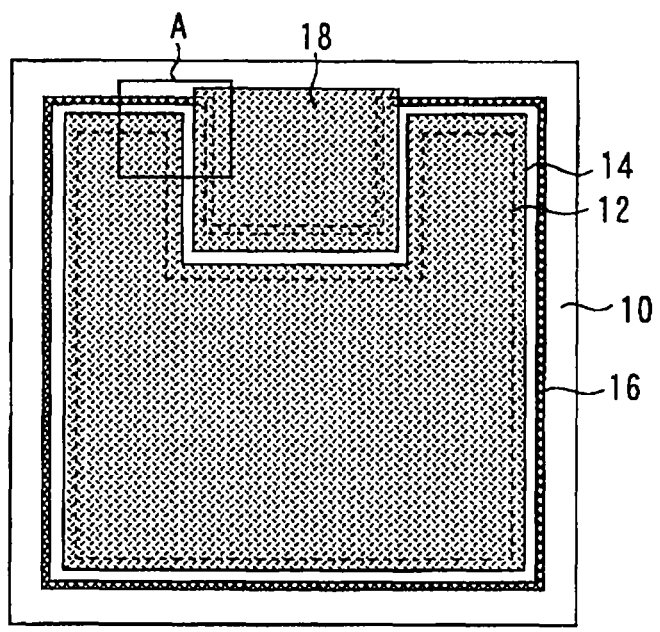
FIG. 1 is a top view showing a semiconductor device according to the first embodiment.

DESCRIPTION OF REFERENCE NUMERALS 10 n-type SiC substrate (semiconductor substrate)
12 cell region
14 source pad (first electrode)
16 gate wiring
18 gate pad
20 n-type SiC drift layer (semiconductor substrate)
22 p-type well (first well)
24 n-type source region (diffusion region)
28 p-type well (second well)
36 gate insulating film (first gate insulating film)
38 gate electrode (first gate electrode)
40 gate insulating film (second gate insulating film)
42 field oxide film
44 gate electrode (second gate electrode)
46 interlayer insulating film
60 drain electrode (second electrode)
74 emitter electrode (first electrode)
76 n-type emitter region (diffusion region)
78 collector electrode (second electrode)
80 p-type collector layer (collector layer)

BEST MODE FOR CARRYING OUT THE INVENTION

First Embodiment

Structure of Device

FIG. 1 is a top view showing a semiconductor device according to the first embodiment. An n-type SiC substrate 10 has an upper surface (first major surface) and a lower surface (second major surface) facing to each other. On the upper surface of the n-type SiC substrate 10, a cell region 12, wherein a plurality of unit cells (not shown in FIG. 1) being the minimum unit structure of the MOSFET are placed in parallel are present. On this cell region 12, a source pad 14 (source electrode) connected to the sources of respective unit cells is formed. On the peripheral portion of the cell region 12, a gate wiring 16 is formed so as to go around the periphery of the cell region 12 and to isolate from the source pad 14.

A gate pad 18 is formed on the peripheral portion of the cell region 12 (specifically, the central portion of a side of the periphery of the upper surface of the n-type SiC substrate 10). The gate pad 18 is electrically connected to a gate wiring 16. A gate voltage is supplied to the gate pad 18 from an exterior control circuit (not shown). The gate voltage is supplied to the gate of each unit cell via the gate wiring 16.

Figure 2:
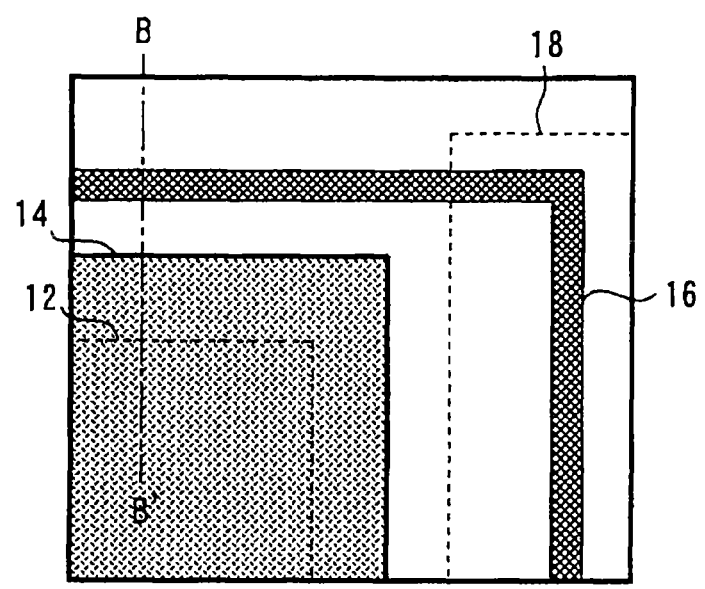
FIG. 2 is a top view showing an enlarged region A in FIG. 1.
Figure 3:
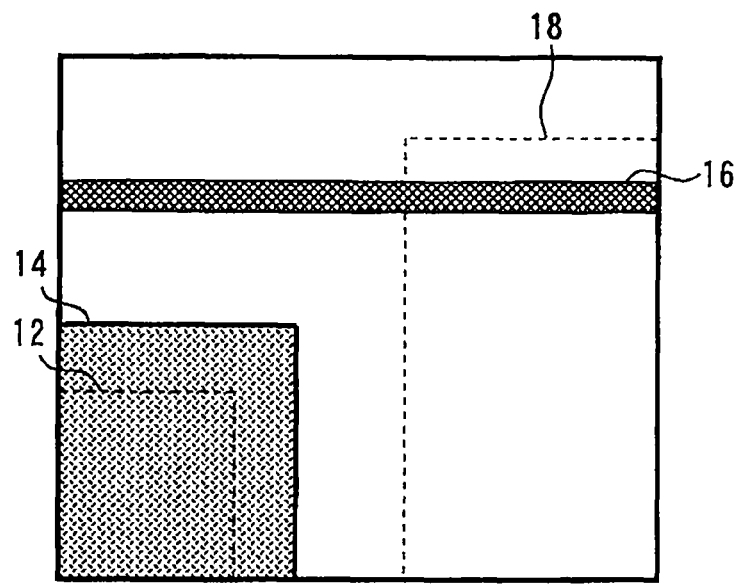
FIGS. 3 and 4 are top views showing the modified example of FIG. 2.
Figure 4:
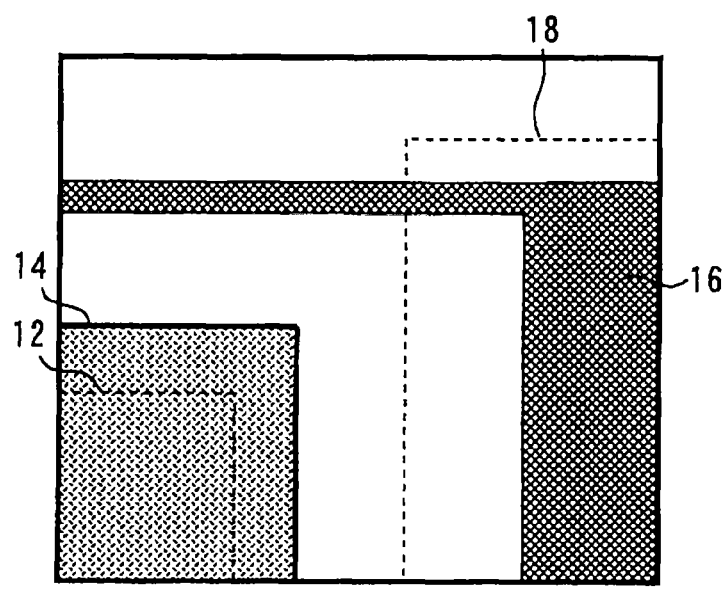

FIG. 2 is a top view showing an enlarged region A in FIG. 1. In FIG. 2, the gate pad 18 in phantom is shown by broken lines. The gate wiring 16 passes through the lower part of the drawing in the downside region of the gate pad 18, and goes out from the upper left and the upper right. FIGS. 3 and 4 are top views showing the modified example of FIG. 2. In FIG. 3, the gate wiring 16 passes through the upper part of the drawing in the downside region of the gate pad 18, and goes out from the upper left and the upper right. In FIG. 4, the gate wiring 16 spreads to the entire surface in the downside region of the gate pad 18, and goes out from the upper left and the upper right.

Figure 5:
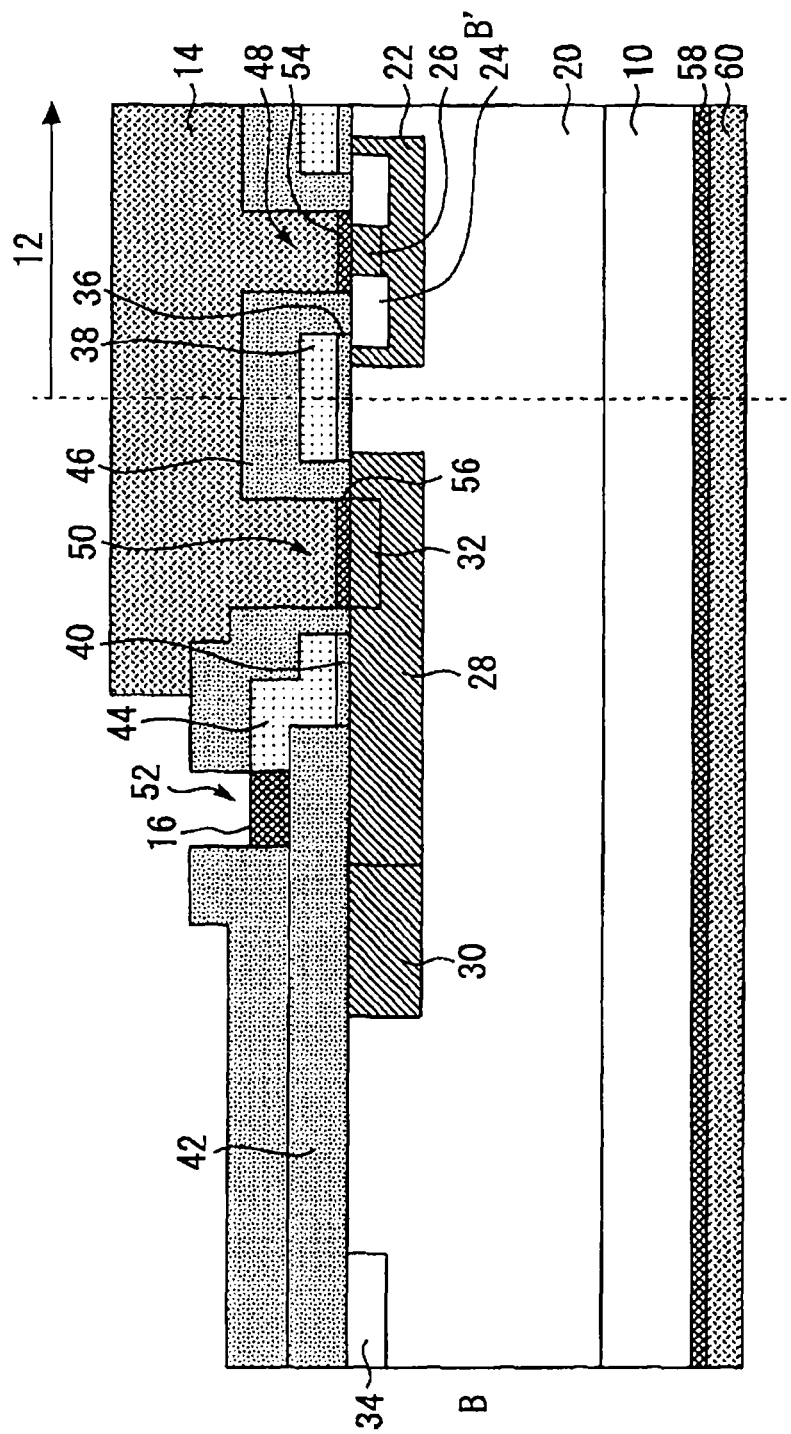
FIG. 5 is a sectional view taken along B-B' in FIG. 2.

FIG. 5 is a sectional view taken along B-B' in FIG. 2. An n-type SiC drift layer 20 is formed on the n-type SiC substrate 10. The impurity concentration of the n-type SiC drift layer 20 is $1\times10^{13}$ cm$^{-3}$ to $1\times10^{18}$ cm$^{-3}$, and the thickness is 5 μm to 200 μm.

In the cell region 12, a p-type well 22 is formed in the upper surface of the n-type SiC drift layer 20. In the p-type well 22, an n-type source region 24 and a p$^+$-type well contact region 26 is formed in the upper surface of the n-type SiC drift layer 20. The bottom surface of the n-type source region 24 is not above the bottom surface of the p-type well 22. The impurity concentration of the n-type source region 24 is $1\times10^{17}$ cm$^{-3}$ to $1\times10^{21}$ cm$^3$, and exceeds the impurity concentration of the p-type well 22.

In the peripheral portion of the cell region 12, a p-type well 28 and a JTE (junction termination extension) region 30 are formed in the upper surface of the n-type SiC drift layer 20. In the p-type well 28, a p$^+$-type well contact region 32 is formed in the upper surface of the n-type SiC drift layer 20. In the upper surface of the outer end of the n-type SiC drift layer 20, an n-type field stopper region 34 is formed.

The depth of the p-type wells 22 and 28 is, for example, 0.3 μm to 2.0 μm, and does not exceed the bottom surface of the n-type SiC drift layer 20. The impurity concentration of the p-type wells 22 and 28 is $1\times10^{15}$ cm$^{-3}$ to $1\times10^{19}$ cm$^{-3}$, and exceeds the impurity concentration of the n-type SiC drift layer 20. However, only in the vicinity of the most outer surface of the n-type SiC drift layer 20, the impurity concentration of the p-type wells 22 and 28 can be lower than the impurity concentration of the n-type SiC drift layer 20 in order to elevate the electrical conductivity of the channel region of the SiC semiconductor device. Meanwhile, N (nitrogen) or P (phosphorus) is preferable as the n-type impurity, and Al (aluminum) or B (boron) is preferable as the p-type impurity.

A gate insulating film 36 is formed on the p-type well 22. A gate electrode 38 is formed on the gate insulating film 36. On the other hand, a gate insulating film 40 is formed on the p-type well 28. On the peripheral side than the gate insulating film 40, a field oxide film 42 is formed on the p-type well 28. It is preferable that the thickness of the field oxide film 42 is approximately 10 times the thickness of the gate insulating film 40, for example, 0.5 µm to 2 µm. Then, a gate electrode 44 is formed sequentially on the gate insulating film 40 and the field oxide film 42. This gate electrode 44 is electrically connected to the gate electrode 38. The gate electrodes 38 and 44 are composed of poly-silicon.

The gate wiring 16 is formed on the field oxide film 42 in the peripheral side from the gate electrode 44. The gate wiring 16 is electrically connected to the gate electrode 44. The gate wiring 16 is composed of silicided poly-silicon.

An interlayer insulating film 46 is formed on the entire surface; on the interlayer insulating film 46, a contact hole 48 is formed on the n-type source region 24 and the p$^+$-type well contact region 26; a contact hole 50 is formed on the p$^+$-type well contact region 32; and a contact hole 52 is formed on the gate wiring 16. The widths of the contact holes 48, 50, and 52 are 0.1 µm to 100 µm. However, it is preferable that the widths of the contact holes 50 and 52 are as short as possible (e.g., several µm) to shrink the width of the p-type well 28.

An ohmic electrode 54 is ohmically contacted to the n-type source region 24 and the p$^+$-type well contact region 26 via the contact hole 48, and an ohmic electrode 56 is ohmically contacted to the p$^+$-type well contact region 32 via the contact hole 50. The source pad 14 is electrically contacted to the p-type wells 22 and 28, and the n-type source region 24 via the ohmic electrodes 54 and 56. Furthermore, a back-face ohmic electrode 58 is ohmically contacted to the lower surface of the n-type SiC substrate 10, and a drain electrode 60 is formed on the back-face ohmic electrode 58.

On the cell region 12, a plurality of unit cells of the vertical MOSFET are formed. Each unit cell contains the p-type well 22, a p$^+$-type well contact region 26, and an n-type source region 24. On the other hand, a diode is formed on the peripheral portion of the cell region 12. Each diode contains an n-type SiC drift layer 20, the p-type well 28 and the p$^+$-type well contact region 32. Each diode is connected in parallel to each unit cell. A source pad 14 is connected to the anode of the diode, and a drain electrode 60 is connected to the cathode of the diode.

Figure 23:
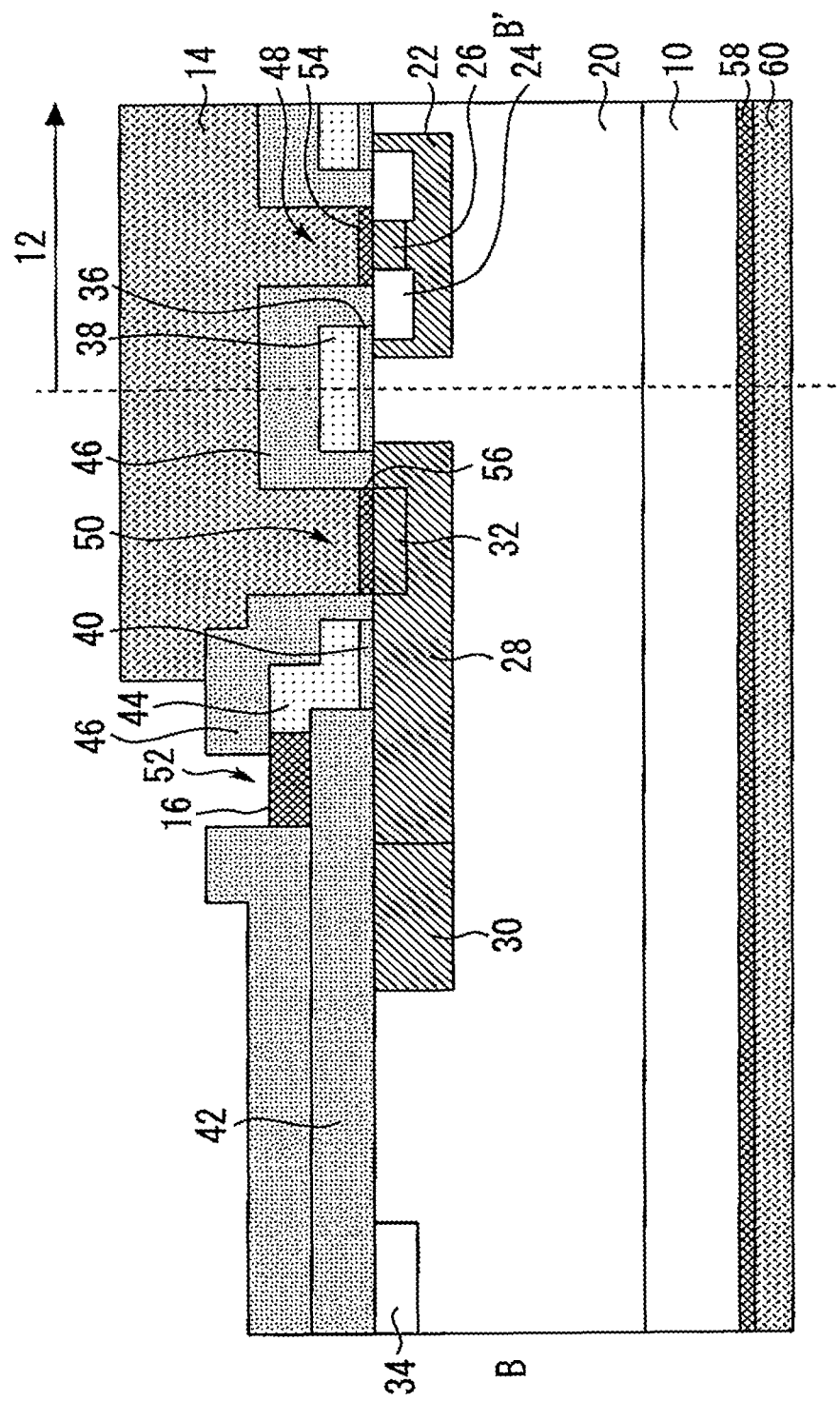
FIG. 23 is a sectional view showing an alternative embodiment of the semiconductor device based on FIG. 5.

FIG. 23 is a sectional view showing an alternative embodiment of the semiconductor device based on FIG. 5. FIG. 23 differs from FIG. 5 in that a reference numeral 46 has been added to the interlayer insulating film which is above the gate electrode 44. Moreover, the interlayer insulating film 46 in the central portion of this figure is over not only the gate electrode 44, but also extends over the gate wiring 16.

Figure 6:
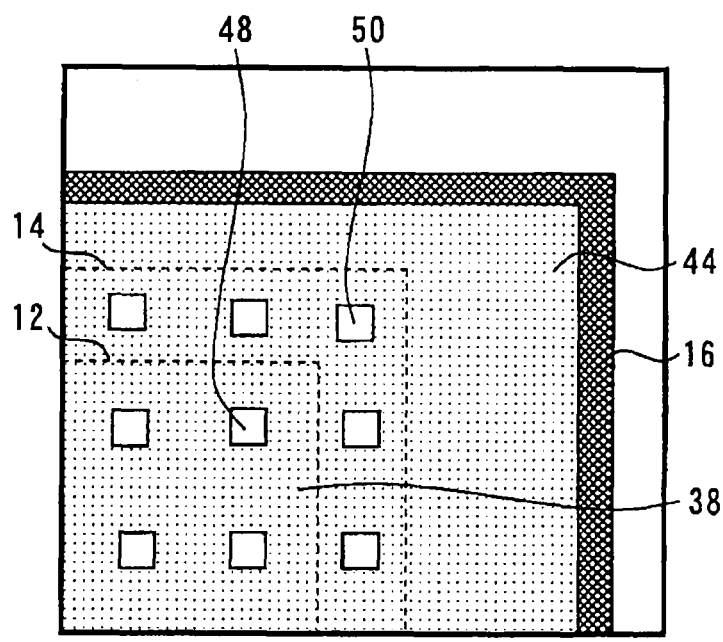
FIG. 6 is a perspective plan view wherein the source pad, the interlayer insulating film, and the gate pad 18 shown in FIG. 2 are omitted.
Figure 7:
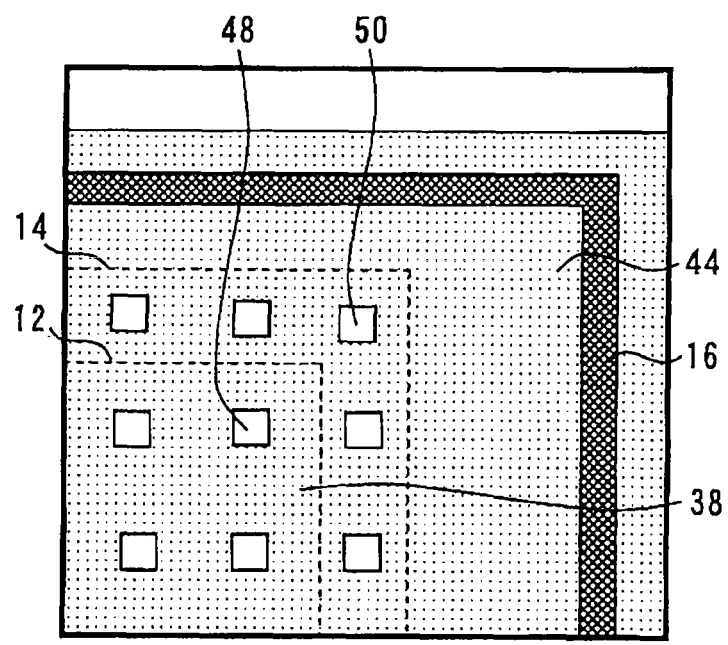
FIG. 7 is a top view showing a modified example shown in FIG. 6.

FIG. 6 is a perspective plan view wherein the source pad 14, the interlayer insulating film 46, and the gate pad 18 shown in FIG. 2 are omitted. The gate wiring 16 is connected to the outside surface of the gate electrode 44. Parts of the gate electrodes 38 and 44 are opened for forming the contact holes 48 and 50. FIG. 7 is a top view showing a modified example shown in FIG. 6. As shown in FIG. 7, the gate electrode 44 may extend outward beyond the gate wiring 16.

Figure 8:
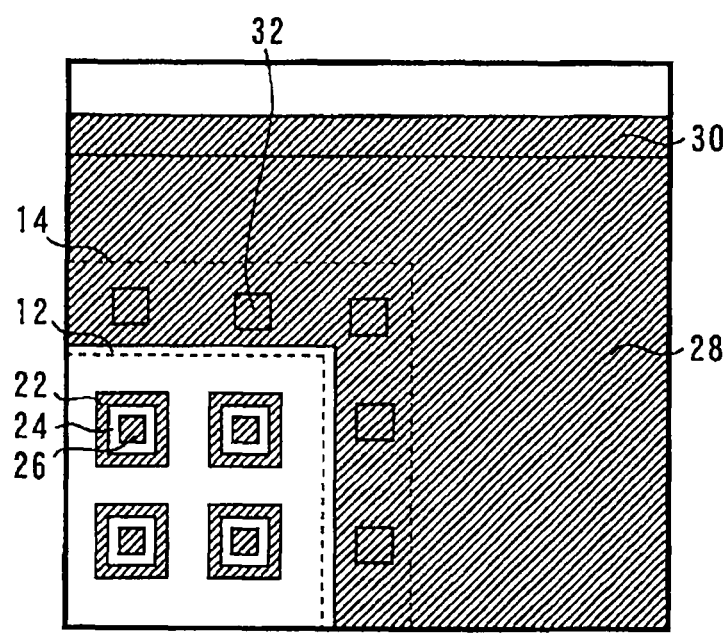
FIG. 8 is a perspective plan view showing the n-type SiC drift layer located below the gate electrode and the field oxide film shown in FIG. 6.

FIG. 8 is a perspective plan view showing the n-type SiC drift layer 20 located below the gate electrode 44 and the field oxide film 42 shown in FIG. 6. On the outer layer of the upper surface of the n-type SiC drift layer 20, the p$^+$-type well contact regions 26 and 32 are formed in the lower central portions of the contact holes 48 and 50, respectively. The n-type source region 24 is formed on the lower portion of the contact hole 48 and the periphery thereof. The p-type well 22 is formed so as to include the p$^+$-type well contact region 26 and the n-type source region 24. The p-type well 28 is formed so as to include the p$^+$-type well contact region 32. The p-type wells 22 and 28, and the n-type source region 24 are electrically connected to the source pad 14 via the contact holes 48 and 50, and become almost the same potential. The p-type well 28 and the JTE region 30 are formed below a part of the field oxide film 42.

Figure 9:
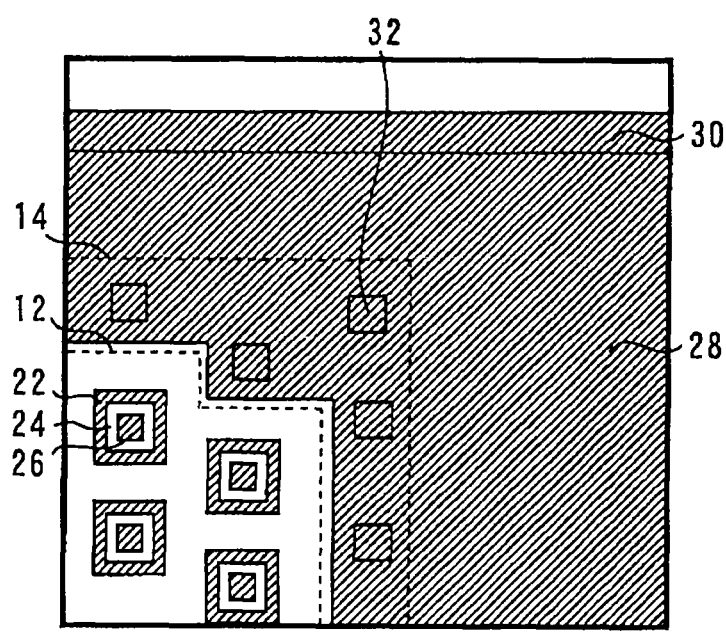
FIG. 9 is a top view showing a modified example shown in FIG. 8.

FIG. 9 is a top view showing a modified example shown in FIG. 8. In FIG. 8, although unit cells and diodes are arranged in a matrix in an equally spaced manner, the unit cells and the diodes may be alternately placed as shown in FIG. 9.

Manufacturing Method of Device

The manufacturing method of the semiconductor device according to the first embodiment will be described. FIGS. 10 to 14 are sectional views for illustrating the manufacturing method of the semiconductor device according to the first embodiment.

Figure 10:
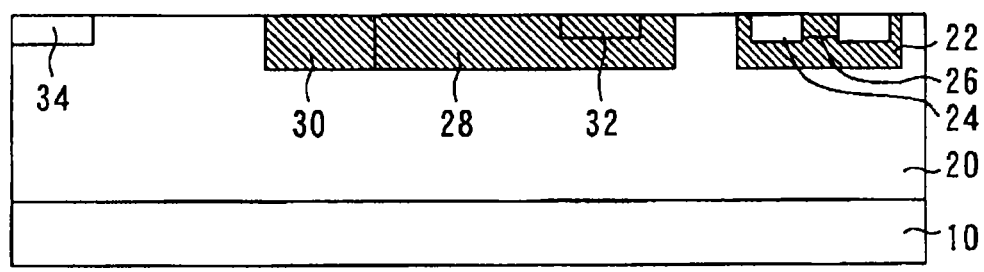
FIGS. 10 to 14 are sectional views for illustrating the manufacturing method of the semiconductor device according to the first embodiment.

First, as shown in FIG. 10, an n-type SiC substrate 10 is prepared. The n-type SiC substrate 10 can be tilted by 8° or below to the c-axis direction, or can be not tilted, and can have any plane orientation. An n-type SiC drift layer 20 is epitaxially grown on the n-type SiC substrate 10.

Next, the ions of an impurity is implanted on the outer layer of the upper surface of the n-type SiC drift layer 20 utilizing a resist mask or an oxide film mask processed by photolithography; and a p-type well 22, a p-type well 28, an n-type source region 24 and a JTE region 30, and an n-type field stopper region 34 are formed.

Next, in order to realize favorable metallic contact of the p-type wells 22 and 28 and the source pad 14, p$^+$-type well contact regions 26 and 32 having a higher impurity concentration than the p-type wells 22 and 28, are formed in the p-type wells 22 and 28 by respectively. The ion implantation is preferably carried out at a substrate temperature of 150° C. or higher.

Next, by carrying out a heat treatment in an inert atmosphere such as argon and nitrogen or in a vacuum at a temperature of 1500° C. to 2200° C. for 0.5 to 60 minutes, the implanted impurity is electrically activated. Thereafter, an oxide film (not shown) is formed on the upper surface of the n-type SiC drift layer 20 by sacrificial oxidation, and the surface altered layer is removed by the removal using the oxide film by hydrofluoric acid to obtain a clear surface.

Figure 11:
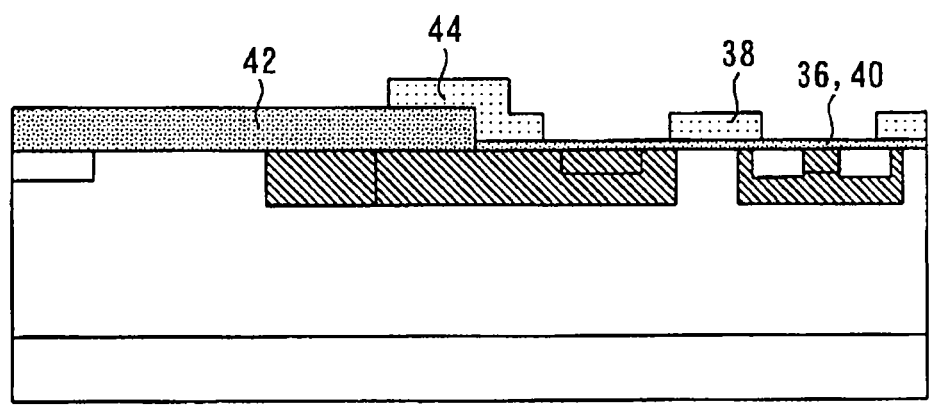

Next, as shown in FIG. 11, a field oxide film 42 composed of a silicon oxide film is laminated by patterning the field oxide film 42 using a CVD method or the like, and openings are formed on the cell region 12 and a diode portion. On the opening portion gate insulating films 36 and 40 are formed by, for example, a thermal oxidation method or a deposition method.

Next, poly-silicon is laminated by a CVD method, and is patterned by photolithography and dry etching to form gate electrodes 38 and 44. In this poly-silicon, phosphorus or boron is contained for lowering the sheet resistance. Phosphorus or boron may be incorporating when the poly-silicon film is formed, or may be introduced by heat treatment.

Here, the outer end surface of the gate electrode 44 is made to be present on the field oxide film 42. Thereby, the quality deterioration of the gate insulating film 40 exposed on the end surface by over etching during the dry etching of the gate electrode 44 can be prevented. Furthermore, the gate wiring 16 to be formed later can be constructed on the field oxide film 42. Thereby, the going through of the gate insulating film 40 due to the silicidation of the gate wiring 16 can be prevented, and the short circuit between the gate and the source.

Figure 12:
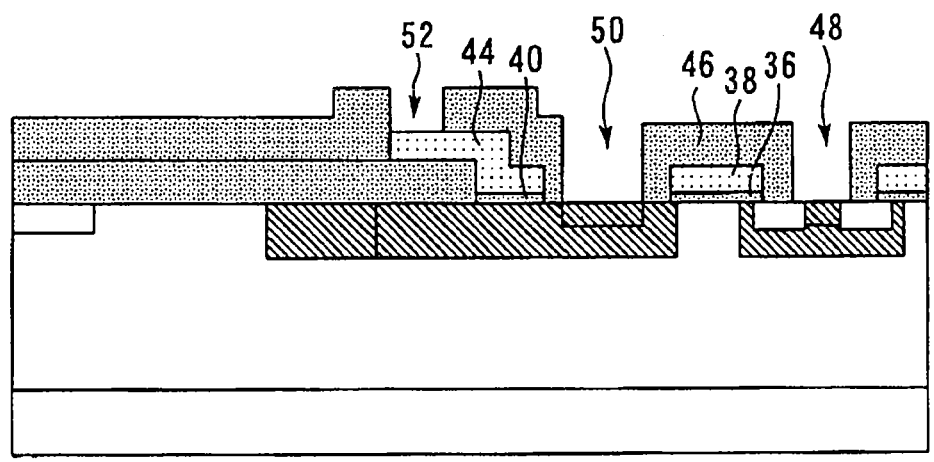
Figure 13:
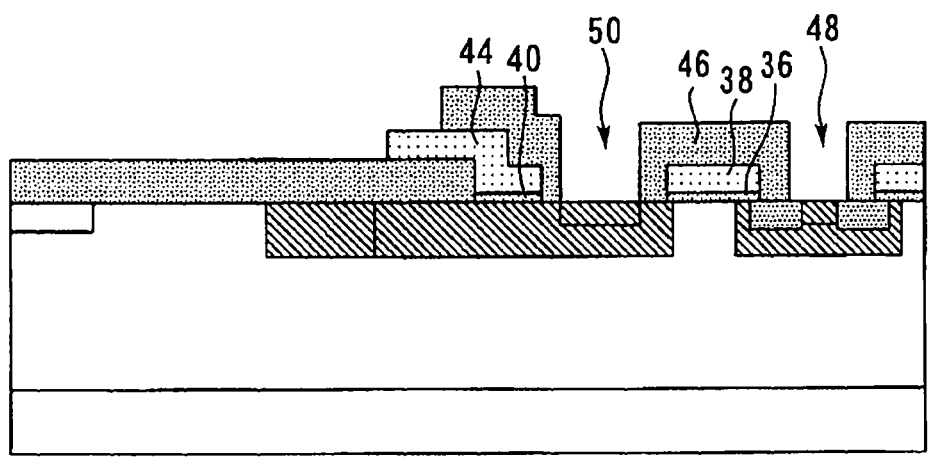

Next, as shown in FIG. 12, an interlayer insulating film 46 is formed on the n-type SiC drift layer 20 using a CVD method or the like so as to cover the gate electrodes 38 and 44. Then, contact holes 48, 50 and 52 are formed by, for example, the dry etching of the interlayer insulating film 46. Also as shown in FIG. 13, a part of the gate electrode 44 may be exposed by removing the entire interlayer insulating film 46 outer than the outer end surface of the gate electrode 44 in place of the contact hole 52.

Figure 14:
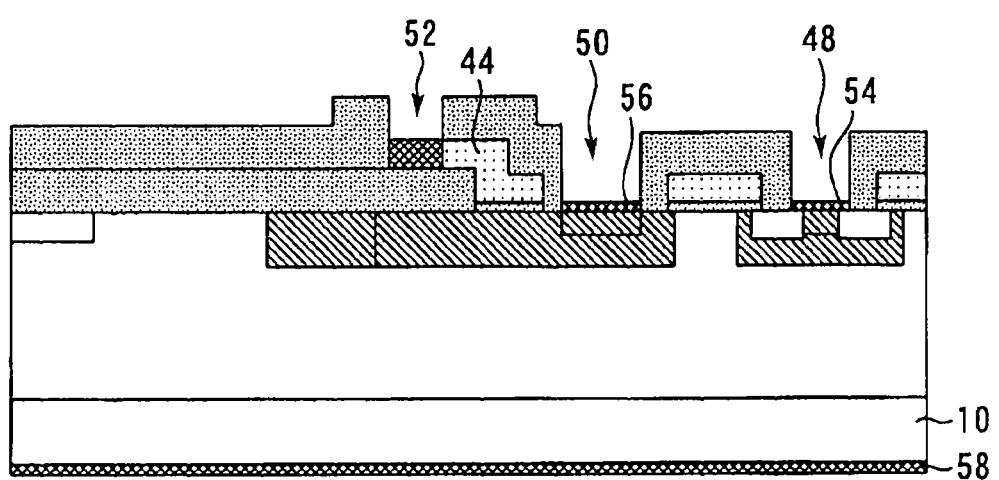

Next, a metal film (not shown) mainly composed of Ni is formed on the entire surface. Then, the silicide of SiC and poly-silicon is formed by the heat treatment at 600 to 1100° C. Furthermore, the metal film remaining on the interlayer insulating film 46 is removed with sulfuric acid, nitric acid, hydrochloric acid, or a mixed solution thereof with hydrogen peroxide, or the like. Thereby, as shown in FIG. 14, self-aligned ohmic electrodes 54 and 56 are formed by the silicidation of the surface of the exposed n-type SiC drift layer 20 in the contact holes 48 and 50. Then, the self-aligned gate wiring 16 is formed by the silicidation of a part of the exposed gate electrode 44 in the contact hole 52.

Here, the reaction rate of the metal film and poly-silicon is faster than the reaction rate of the metal film and SiC. Therefore, when the heat treatment at 1000° C. for 2 minutes is carried out for forming the silicide of the ohmic electrodes 54 and 56, the silicide of the gate wiring 16 is not only formed in the depth direction from the upper surface of poly-silicon contacting to Ni, but also formed on poly-silicon below the interlayer insulating film 46 not contacting to Ni.

In the process for forming the gate wiring 16 and the ohmic electrodes 54 and 56, after forming the similar metal film on the back face of the n-type SiC substrate 10, a heat treatment is carried out to form a back-face ohmic electrode 58. Thereby, favorable ohmic contact is formed between the n-type SiC substrate 10 and the drain electrode 60.

Next, by forming and patterning the wiring metal such as Al by sputtering or vapor deposition, the gate pad 18 and the source pad 14 are formed. Then a metal film is formed on the back-face ohmic electrode 58 to form a drain electrode 60. By the process described above, the semiconductor device according to the first embodiment is manufactured.

Although not shown in the drawing, the surface side of the n-type SiC substrate 10 may be coated with a protective film, such as a silicon nitride film or polyimide film. However, openings are formed in the suitable locations of the protective films of the gate pad 18 and the source pad 14 so as to be able to be connected to the exterior control circuit.

Effects

When a MOSFET is rapidly switched from the ON state to the OFF state, the voltage of a drain electrode (drain voltage) is rapidly elevated from 0 to several hundred volts. Then, displacement current flows in p-type wells 22 and 28 via a parasitic capacitor present between p-type wells 22 and 28, and between the JTE region 30 and the n-type SiC drift layer 20.

Since the area of the p-type well 22 is small, the interior parasitic resistance is small, and even if a rather large displacement current flows, the potential elevation of the p-type well 22 is small. On the other hand, the area of the p-type region formed by the combination of the p-type well 28 and the JTE region 30 is large, the interior parasitic resistance is large, and the potential elevation of the p-type well 28.

Therefore, in the first embodiment, silicide is used as the gate wiring 16 supplying potential to the gate electrodes 38 and 44. The lateral area of silicide can be formed smaller than the conventional metallic gate electrode. For this reason, the distance from the source pad 14 to the outside of the gate wiring 16 can be formed smaller. The p-type well 28 below the gate wiring 16 can be smaller by this shortened portion. Therefore, the displacement current generated in the p-type well 28 becomes smaller, and the potential elevation of the p-type well 28 becomes smaller. Thereby, the generation of the high electric field in the p-type well 28 below the gate insulating film 40 can be prevented, and the breakdown of the gate insulating film 40 can be prevented. Therefore, short-circuiting between gate electrodes 44 and 48, and the source pad 14 due to the breakdown of the gate insulating film 40 can be prevented, and reliability can be improved.

In addition, high electric fields are easily concentrated in the outer end portion of the p-type well 28 (JTE region 30) when the MOSFET is switched from the ON state to the OFF-state. Therefore, in order to prevent short-circuiting between gate electrodes 44 and 48, and the source pad 14 due to the breakdown of the gate insulating film 40, it is required to ensure the distance between the outer end portion of the p-type well 28 (JTE region 30), and the gate electrode 44 and the gate wiring 16. Whereas in the first embodiment, the p-type well 28 can be made smaller while ensuring the distance between the two.

Furthermore, in the first embodiment, the p-type well below the gate wiring 16 and the p-type well of the diode are commonly the p-type well 28. Therefore, the source pad 14 is connected to the p-type well 28 in the interior side than the gate electrode 44 and the gate insulating film 40 on the upper surface. Thereby, since there is no requirement to separately create a field plate to supply potential to the p-type well below the gate wiring 16, the structure becomes simple, and the size of the device can be reduced. Furthermore, since the distance between the portion where the p-type well 28 is connected to the source pad 14 and the gate insulating film 40, the elevation of the potential of the p-type well 28 at the portion below the gate insulating film 40 can be prevented. Therefore, also this constitution has the effect to prevent the breakdown of the gate insulating film 40.

Since the reduction of the resistance of SiC is difficult, the potential generated in the p-type well 28 is elevated. Therefore, the constitution of the first embodiment is especially effective when the material of the substrate is SiC.

The gate electrodes 38 and 44 are composed of poly-silicon. Since the electrical conductivity of poly-silicon is poor, the locations of the gate pad 18, and the gate electrodes 38 and 44 are separated, the temporal distortion occurs in the potentials of the both. This temporal distortion is determined by the resistance of poly-silicon, and the time constant of the parasitic capacitance determined by the source pad 14 and the gate takeoff wiring layer. Therefore, by forming the gate wiring 16 composed of low-resistance silicide so as to round the periphery of the cell region 12, the supply of the potential to the gate electrodes 38 and 44 of respective unit cells is facilitated, and increase in the speed of switching is sought. Furthermore, the gate wiring 16 is formed by siliciding poly-silicon, which is the constituent of the gate electrode 44. Thereby, the gate wiring 16 can be formed by continuously self-aligning to the gate electrode 44.

In normal products, electrodes for the temperature sensor or the current sensor are often formed. In addition, the location and number of the gate pads 18, or the shape of the source pads 14 are of wide variety. However, these have no effects to the semiconductor device according to the first embodiment.

Second Embodiment

Figure 15:
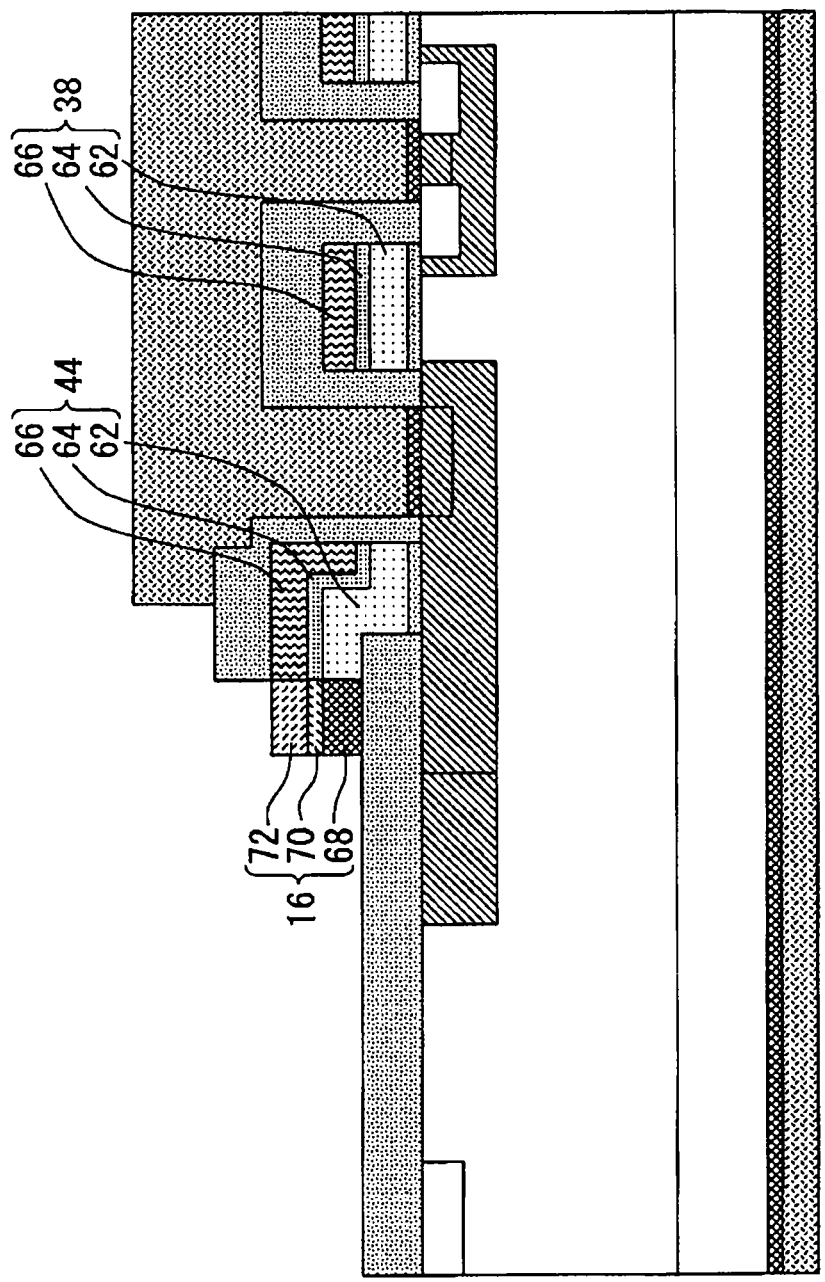
FIG. 15 is a sectional view showing a semiconductor device according to the second embodiment of the present invention.

FIG. 15 is a sectional view showing a semiconductor device according to the second embodiment of the present invention. The gate electrodes 38 and 44 are composed of a laminated film of a poly-silicon layer 62, a metal nitride layer 64, and a metal layer 66. The metal 66 is at least one of Ti, Mo, W, Nb, Ta, and Si. The metal nitride 64 is at least one of the nitride of Ti, Mo, W, Nb, Ta, and Si. The gate wiring 16 is composed of a laminate film of a silicide layer 68 and alloy layers 70 and 72. Other constitutions are identical to the constitution of the first embodiment.

Figure 16:
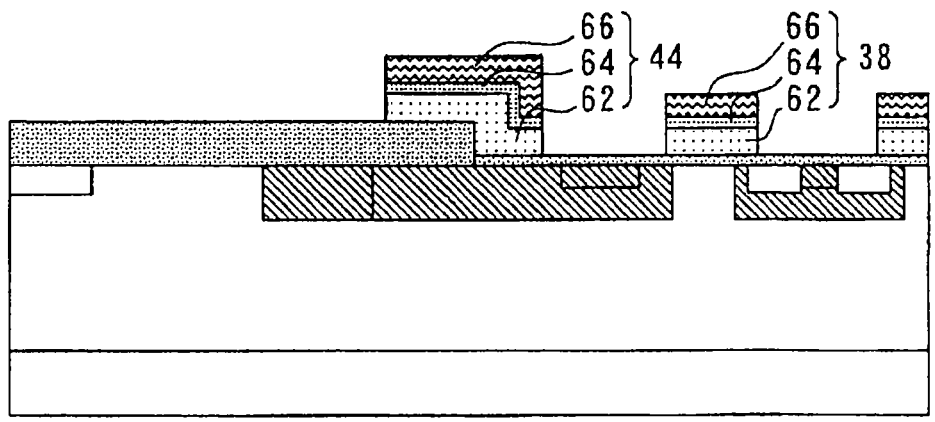
FIGS. 16 to 18 are sectional views for illustrating the manufacturing method of the semiconductor device according to the second embodiment.

The method for manufacturing the semiconductor device according to the second embodiment will be described. First, in place of poly-silicon gate electrodes 38 and 44 shown in FIG. 11 of the first embodiment, poly-silicon layer 62, a metal nitride layer 64, and a metal layer 66 are laminated by a spatter method or a CVD method, and patterned to form gate electrodes 38 and 44 as shown in FIG. 16.

Figure 17:
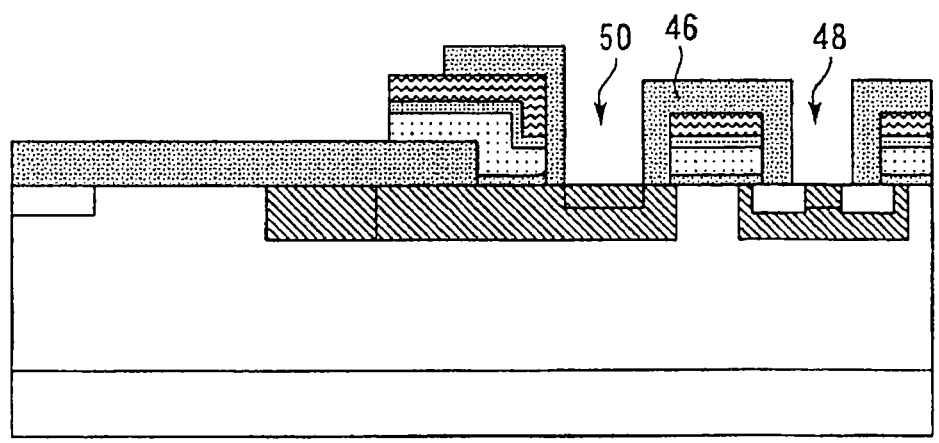

Next, as shown in FIG. 17, an interlayer insulating film 46 is deposited by a CVD method or the like. Then, contact holes 48 and 50 are formed by for example, a dry etching method. At this time, the entire interlayer insulating film 46 outside the outer edge face of the gate electrode 44 is removed, or the interlayer insulating film 46 is patterned so that at least the outer edge face of the gate electrode 44 is exposed.

Figure 18:
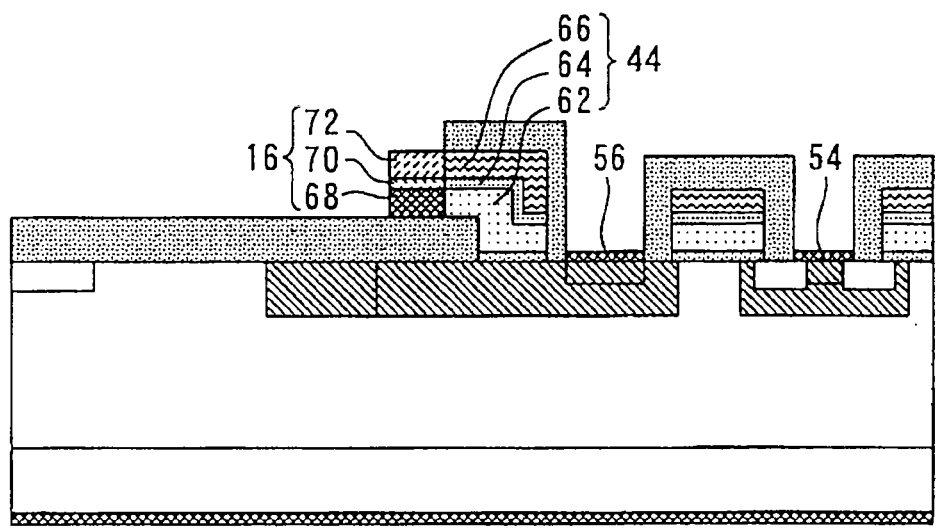

Next, as shown in FIG. 18, in the same manner as in the first embodiment, the gate wiring 16 and the ohmic electrodes 54 and 56 are formed. Here, the poly-silicon 62, the metal nitride 64, and the metal 66 constituting the gate electrode 44 contact to the metal film (not shown) at the respective sidewalls of the gate electrode 44 before the heat treatment for siliciding, and become the silicide layer 68, and the alloys 70 and 72 by heat treatment, respectively. By this heat treatment, the metal nitride 64 prevents the diffusion of the metal 66 into the poly-silicon 62. If the heat treatment temperature is low, although three or more layers separated by nitrogen distribution or silicon distribution are formed. However, if the heat treatment temperature is high, an alloy layer having unclear borders due to mutual diffusion is formed.

Next, in the same manner as in the first embodiment, the gate pad 18, the source pad 14, and the drain electrode 60 are formed, by the above-described processes, the semiconductor device according to the second embodiment is manufactured.

In the second embodiment, the gate electrodes 38 and 44 are composed of the laminated film of a poly-silicon layer 62, a metal nitride layer 64, and a metal layer 66. Thereby, since the sheet resistance of the gate electrodes 38 and 44 is lowered, the faster switching operation can be performed.

Third Embodiment

Figure 19:
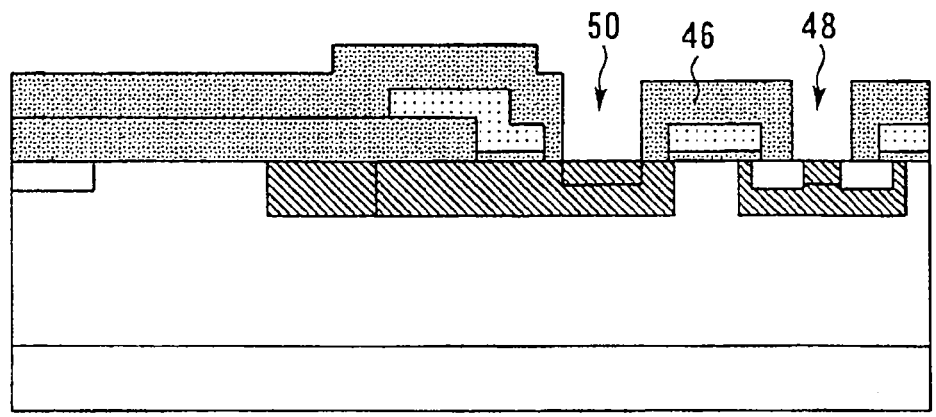
FIGS. 19 to 21 are sectional views for illustrating the manufacturing method of the semiconductor device according to the third embodiment.

The method for manufacturing the semiconductor device according to the third embodiment will be described. First, the structure shown in FIG. 11 of the first embodiment is formed. Then, as shown in FIG. 19, an interlayer insulating film 46 is deposited, and contact holes 48 and 50 are formed. Specifically, unlike the first embodiment, the contact hole 52 is not formed at this time, and the gate electrode 44 is not exposed.

Figure 20:
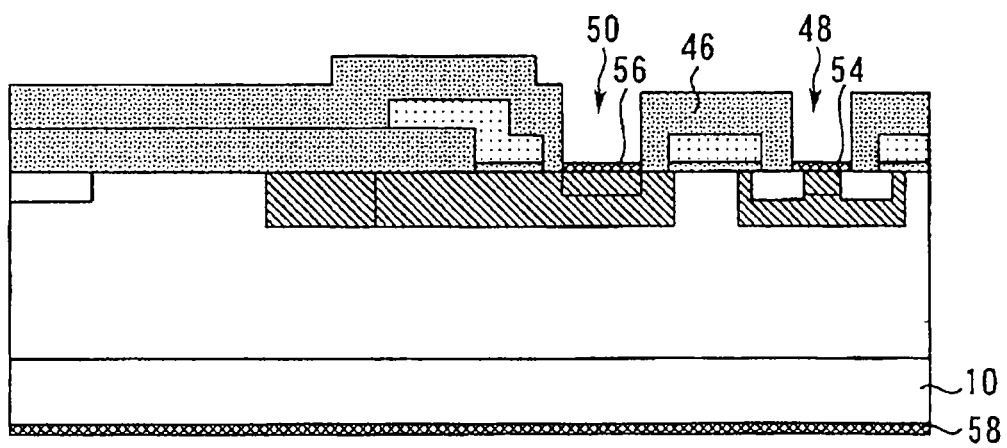

Next, a metal film (not shown) mainly composed of Ni is formed on the entire surface. Then, SiC and silicide with poly-silicon is formed by heat treatment at 600 to 1100° C. Further, the metal film remaining on the interlayer insulating film 46 is removed using sulfuric acid, nitric acid, hydrochloric acid, or the mixed solution thereof with hydrogen peroxide. Thereby, as shown in FIG. 20, the surface of the n-type SiC drift layer 20 exposed in the contact holes 48 and 50 is silicified to form the ohmic electrodes 54 and 56. At this time, a heat treatment is performed after forming the similar metal film on the back face of the n-type SiC substrate 10 to form a back-face ohmic electrode 58.

Figure 21:
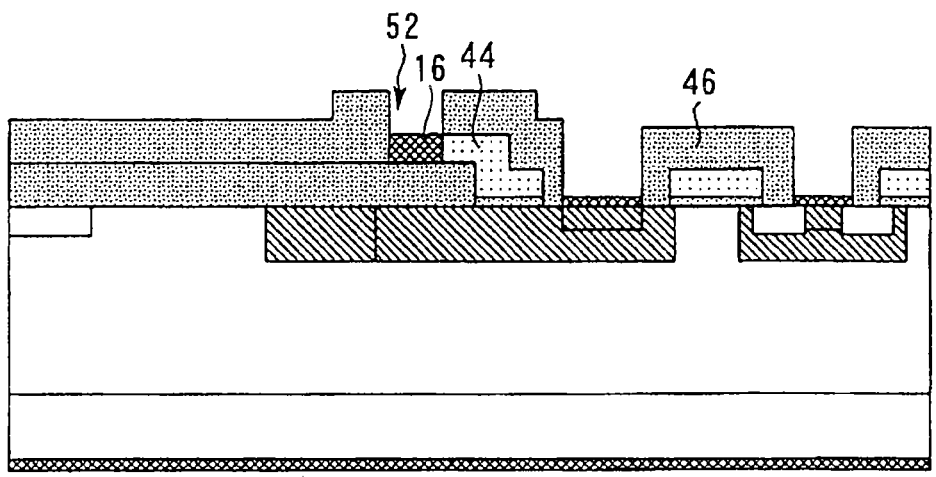

Next, as shown in FIG. 21, a contact hole 52 is formed in the interlayer insulating film 46 to expose a part of the gate electrode 44. Then, a metal film (not shown) mainly composed of Ni on the entire surface, and a part of the exposed gate electrode 44 is silicified to form the gate wiring 16.

Next, in the same manner as in the first embodiment, the gate pad 18, the source pad 14, and the drain electrode 60 are formed. By the process as described above, the semiconductor device according to the third embodiment is manufactured.

In the third embodiment, since the ohmic electrodes 54 and 56, and the gate wiring 16 are separately formed, the constitution of the gate wiring 16 can be optionally designed.

Here, the reaction rate of the metal film with poly-silicon is faster than the reaction rate of the metal film with SiC. Therefore, in the latter case, silicide can be formed at a lower temperature than the former case. For this reason, the gate wiring 16 can be formed by the heat treatment at a lower temperature than the temperature for forming the ohmic electrodes 54 and 56, for example, at 400° C. The metal film forming the poly-silicon and the silicide layer is not necessarily the same as the metal film used when the ohmic electrodes 54 and 56 are formed, but can be optionally selected. For example, when the low-temperature process if favorable, a metal film forming a silicide layer at a lower temperature can be selected. By forming the gate wiring 16 at a low temperature, the abnormal diffusion of the metal into poly-silicon can be prevented. Thereby, the discrepancy of the element by the poor insulation of the gate insulating film 40 or the field oxide film 42 due to such an abnormal diffusion can be suppressed, and the rate of conforming products can be improved.

The method for manufacturing the semiconductor device according to the third embodiment can also be applied to the products wherein the gate electrodes 38 and 44 are composed of laminated films as in the second embodiment.

Fourth Embodiment

Figure 22:
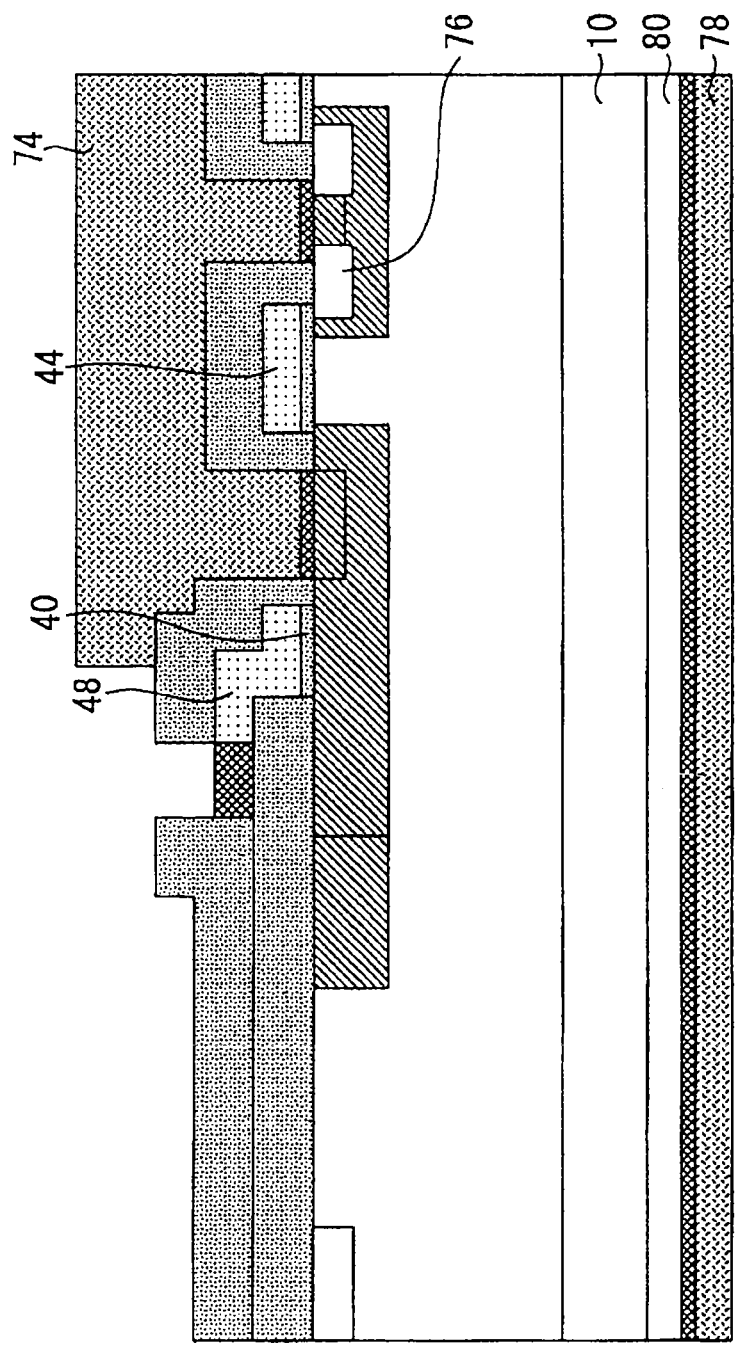
FIG. 22 is a sectional view showing the semiconductor device according to the fourth embodiment.

FIG. 22 is a sectional view showing the semiconductor device according to the fourth embodiment. An emitter electrode 74 is formed in place of the source pad 14 in the first embodiment; an n-type emitter region 76 is formed in place of the n-type source region 24; and a collector electrode 78 is formed in place of the drain electrode 60. A p-type collector layer 80 is formed between the lower face of the n-type SiC substrate 10 and the collector electrode 78. Other constitutions are identical to the constitutions of the first embodiment. Specifically, while the vertical MOSFET is formed in the cell region 12 of the first embodiment, an IGBT is formed in the cell region 12 of the fourth embodiment. By this constitution, the short-circuiting between the gate electrodes 44 and 48, and the emitter electrode 74 due to the breakdown of the gate insulating film 40 can be prevented, and the reliability can be improved.

As described above, the present invention can be applied to the switching elements having the MOS structure such as MOSFET and IGBT. However, the semiconductor devices according to the present invention include not only switching elements, but also power modules, such as free-wheel diodes connected in inverse parallel to the switching elements, and invertor modules wherein control circuits or the like to form and supply the gate voltage of the switching elements are mounted on the lead frame.

INDUSTRIAL APPLICABILITY

The present invention can be used in electrical power converters, such as invertors.

What is claimed is:

1. A semiconductor device comprising:
a semiconductor substrate having a first major surface and a second major surface facing each other;
a drift layer of a first conductivity type on the first major surface;
a first well of a second conductivity type in an upper portion of the drift layer disposed in a center of the semiconductor device;
a diffusion layer of a first conductivity type in an upper portion of the first well;
a second well of a second conductivity type in another upper portion of the drift layer disposed in a peripheral region of the semiconductor device;
a first electrode disposed above the first major surface of the semiconductor substrate and electrically connected to the first well and the second well;
a second electrode under the second major surface of the semiconductor substrate; a first gate insulating film on the first well, a second gate insulating film on the second well;
a field oxide film on the second well;
a gate electrode on the second gate insulating film and the field oxide film; and
a gate wiring film including a silicide and disposed on the field oxide film; wherein
a bottom surface of the gate wiring contacts a top surface of the field oxide; and
the gate wiring contacts a side portion of the gate electrode disposed further from the center of the semiconductor device.

2. The semiconductor device according to claim 1, further comprising:
an interlayer insulating film disposed on the gate electrode,
wherein the gate wiring is further disposed under the interlayer insulating film.

3. The semiconductor device according to claim 1, further comprising:
a gate pad including metal and electrically connected to the gate wiring.

4. The semiconductor device according to claim 1, wherein the gate wiring extends outwardly away from the gate electrode.

5. The semiconductor device according to claim 1, wherein the gate wiring includes Ni.

6. The semiconductor device according to claim 1, wherein the gate wiring is self-aligned.

7. The semiconductor device according to claim 1, wherein:
the drift layer has a first impurity concentration in a first range of $1\times10^{13}$ cm$^{-3}$ to $1\times10^{18}$ cm$^{-3}$:
the second well has a second impurity concentration in a second range of $1\times10^{15}$ cm$^{-3}$ to $1\times10^{19}$ cm$^{-3}$; and
the first impurity concentration exceeds the second impurity concentration only in the vicinity of an outer surface of the drift layer.

8. The semiconductor device according to claim 1, wherein the gate electrode includes poly-silicon.

9. The semiconductor device according to claim 1, wherein the semiconductor substrate and the drift layer are SiC.

10. A semiconductor device comprising:
a semiconductor substrate having a first major surface and a second major surface facing each other;
a drift layer of a first conductivity type on the first major surface;
a first well of a second conductivity type in an upper portion of the drift layer disposed in a center of the semiconductor device;
a diffusion layer of a first conductivity type in an upper portion of the first well;
a second well of a second conductivity type in another upper portion of the drift layer disposed in a peripheral region of the semiconductor device;
a first electrode above the first major surface of the semiconductor substrate and electrically connected to the first well and the second well:
a second electrode under the second major surface of the semiconductor substrate; a first gate insulating film on the first well; a second gate insulating film on the second well;
a field oxide film on the second well,
a gate electrode on the second gate insulating film and the field oxide film;
an interlayer insulating film disposed on the gate electrode and having a contact hole; and
a gate wiring including a silicide and disposed on an the field oxide film at a bottom of the contact hole of the interlayer insulating film;
wherein the gate wiring is further disposed under the interlayer insulating film.

11. The semiconductor device according to claim 10, further comprising:
a gate pad including metal and electrically connected to the gate wiring.

12. The semiconductor device according to claim 10, wherein the gate wiring extends outwardly away from the gate electrode.

13. The semiconductor device according to claim 10, wherein the gate wiring is connected to a side surface of the gate electrode.

14. The semiconductor device according to claim 10, wherein the gate wiring includes Ni.

15. The semiconductor device according to claim 10, wherein the gate wiring is self-aligned.

16. The semiconductor device according to claim 10, wherein the gate electrode includes poly-silicon.

17. The semiconductor device according to claim 10, wherein the semiconductor substrate and the drift layer are SiC.

18. The semiconductor device according to claim 10, wherein:
- a width of the contact hole of the interlayer insulating film is 0.1 μm to 100 μm.

19. A semiconductor device comprising:
- a semiconductor substrate having a first major surface and a second major surface facing each other;
- a drift layer of a first conductivity type on the first major surface:
- a first well of a second conductivity type in an upper portion of the drift layer disposed in a center of the semiconductor device:
- a diffusion layer of a first conductivity type in an upper portion of the first well:
- a second well of a second conductivity type in another upper portion of the drift layer disposed in a peripheral region of the semiconductor device;
- a first electrode above the first major surface of the semiconductor substrate and electrically connected to the first well and the second well;
- a second electrode under the second major surface of the semiconductor substrate:
- a first gate insulating film on the first well;
- a second gate insulating film on the second well;
- a field oxide film on the second well:
- a gate electrode on the second gate insulating film and the field oxide film;
- an interlayer insulating film disposed on the gate electrode and having a contact hole; and
- a gate wiring including a silicide and disposed on the field oxide film at a bottom of the contact hole of the interlayer insulating film: wherein: the drift layer has a first impurity concentration in a first range of $1\times10^{13}$ cm$^{-3}$ to $1\times10^{18}$ cm$^{-3}$;
- the second well has a second impurity concentration in a second range of $1\times10^{15}$ cm$^{-3}$ to $1\times10^{19}$ cm$^{-3}$; and the first impurity concentration exceeds the second impurity concentration only in the vicinity of an outer surface of the drift layer.

* * * * *